(12) United States Patent
Wu

(10) Patent No.: US 6,767,112 B2
(45) Date of Patent: Jul. 27, 2004

(54) PROJECTION LAMP WITH LED MATRIX PANEL

(76) Inventor: Jiahn-Chang Wu, No.15, Lane 13, Alley 439, Her-Chiang Street, Chutung, Hsin-Chu (TW), 310

( * ) Notice: Subject to any disclaimer, the term of this patent is extended or adjusted under 35 U.S.C. 154(b) by 0 days.

(21) Appl. No.: 10/156,286

(22) Filed: May 29, 2002

(65) Prior Publication Data

US 2003/0223236 A1 Dec. 4, 2003

(51) Int. Cl.[7] ............................................... F21V 7/00
(52) U.S. Cl. ...................... 362/247; 362/800; 362/231; 362/245; 362/247; 362/308; 362/373; 362/545
(58) Field of Search ................................ 362/370, 373, 362/545, 247, 800, 555, 231, 230, 227, 235, 245, 296, 297, 308, 278, 368; 313/500

(56) References Cited

U.S. PATENT DOCUMENTS

| | | | | |
|---|---|---|---|---|
| 3,628,852 A | * | 12/1971 | Snaper et al. | ............... 359/849 |
| 4,460,939 A | * | 7/1984 | Murakami et al. | ............ 362/31 |
| 6,260,994 B1 | * | 7/2001 | Matsumoto et al. | ........ 362/574 |
| 6,595,671 B2 | * | 7/2003 | Lefebvre et al. | ............ 362/545 |

* cited by examiner

*Primary Examiner*—Stephen Husar
*Assistant Examiner*—Sharon Payne
(74) *Attorney, Agent, or Firm*—H. C. Lin

(57) ABSTRACT

One or more LED panel is used as a light source of a light projector. The LEDs are mounted on a panel and arranged as a matrix array. The light emitted from the LEDs are reflected by a reflecting cup. The LEDs are connected to two separate metal parts each connected the two electrodes of the LEDs. The spaces between the LEDs are utilized for light passage.

17 Claims, 24 Drawing Sheets

PROJECTION LAMP WITH LED MATRIX PANEL

BACKGROUND OF THE INVENTION (1) Field of the Invention

This invention relates to projection lamp, particularly to projection lamp using light emitting diodes (LED)

(2) Brief Description of Related Art

FIG. 1 shows a prior art projection lamp. A light bulb SO is located at the focal point of a reflecting cup. The light rays from the light bulb SO is reflected by the wall of the cup 1 as light rays L1, L2. The drawback of such a lighting system is that when high intensity light is required, the light bulb must be of high wattage, which consumes a great deal of energy, generates a great deal of heat and shortens the life of the light bulb.

SUMMARY OF THE INVENTION

An object of the present invention is to increase the efficiency of a projection lamp. Another object of this invention is to reduce overheating of a projection lamp. Still another object of this invention is to increase the life of the light source of a projection lamp.

These objects are achieved by using a panel of light emitting diode (LED) matrix array as a light source. The LEDs face the inner surface of one or more reflecting cups or surfaces. The reflected light rays beam through the space between the LEDs for projection away from the reflecting surfaces. The LED panel has two metal parts, each connected separately to the two electrodes of the LED. The two metal parts are separated by wide air space to allow light passage.

BRIEF DESCRIPTION OF THE SEVEFRAL VIEWS OF THE DRAWINGS

DETAILED DESCRIPTION OF THE INVENTION

Figure 1:
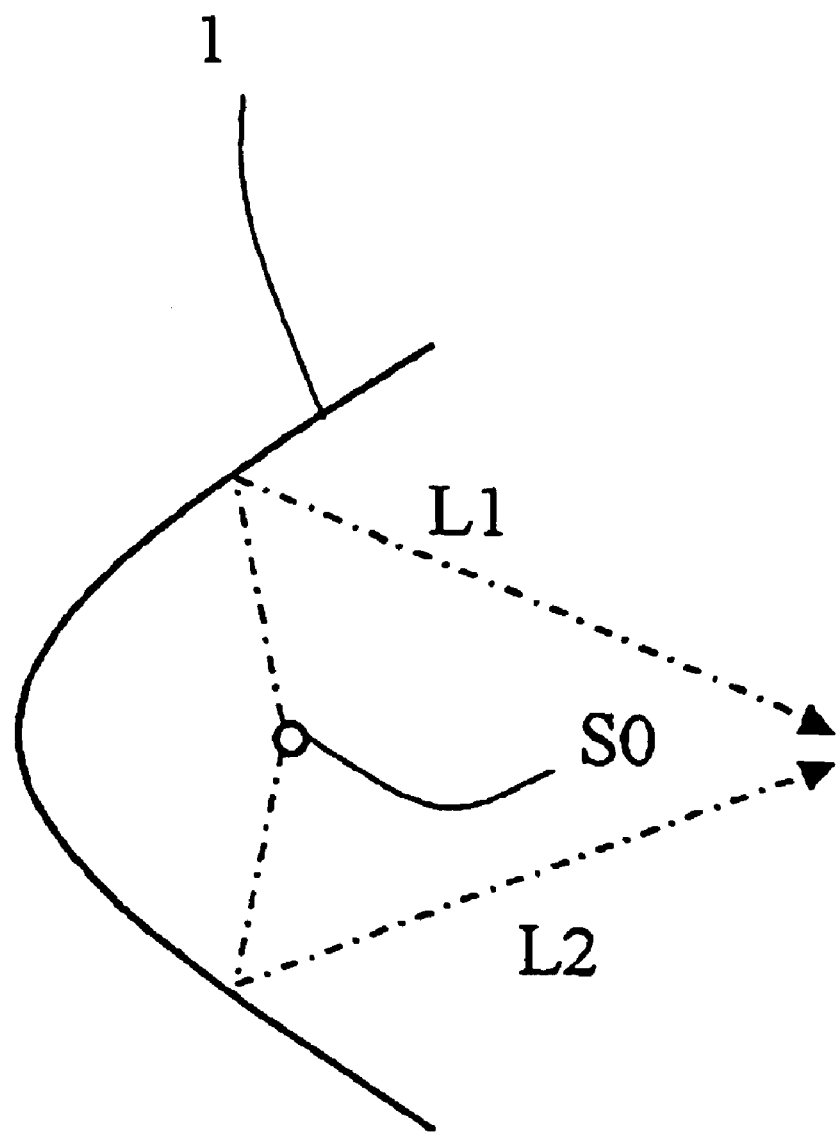
FIG. 1 shows a prior art projection light source using a single light bulb.
Figure 2:
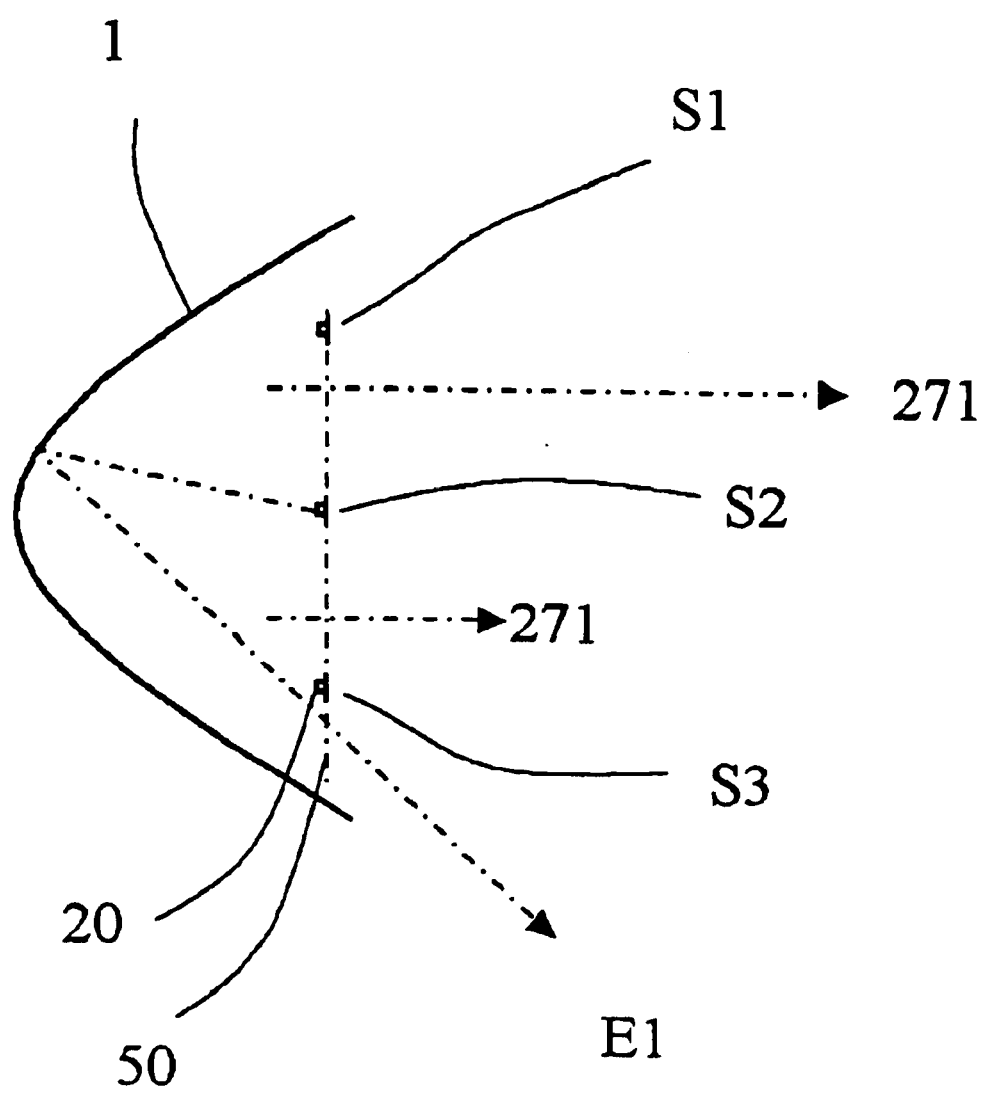
FIG. 2 shows the first embodiment of the present invention using a LED panel as light source.

FIG. 2 shows the basic structure of the present invention. A light panel 50 is mount with an array of LEDs 20 such as S1, S2, S3. The LEDs generate light toward a light reflecting cup 1, which reflects the light. For instance, the light emitted from S2 is reflected as light beam E1, which beams through the spaces 271 between the LEDs away from the reflector 1. Since there is an array of LEDs, the combined reflected light beams form a flood light.

Figure 3:
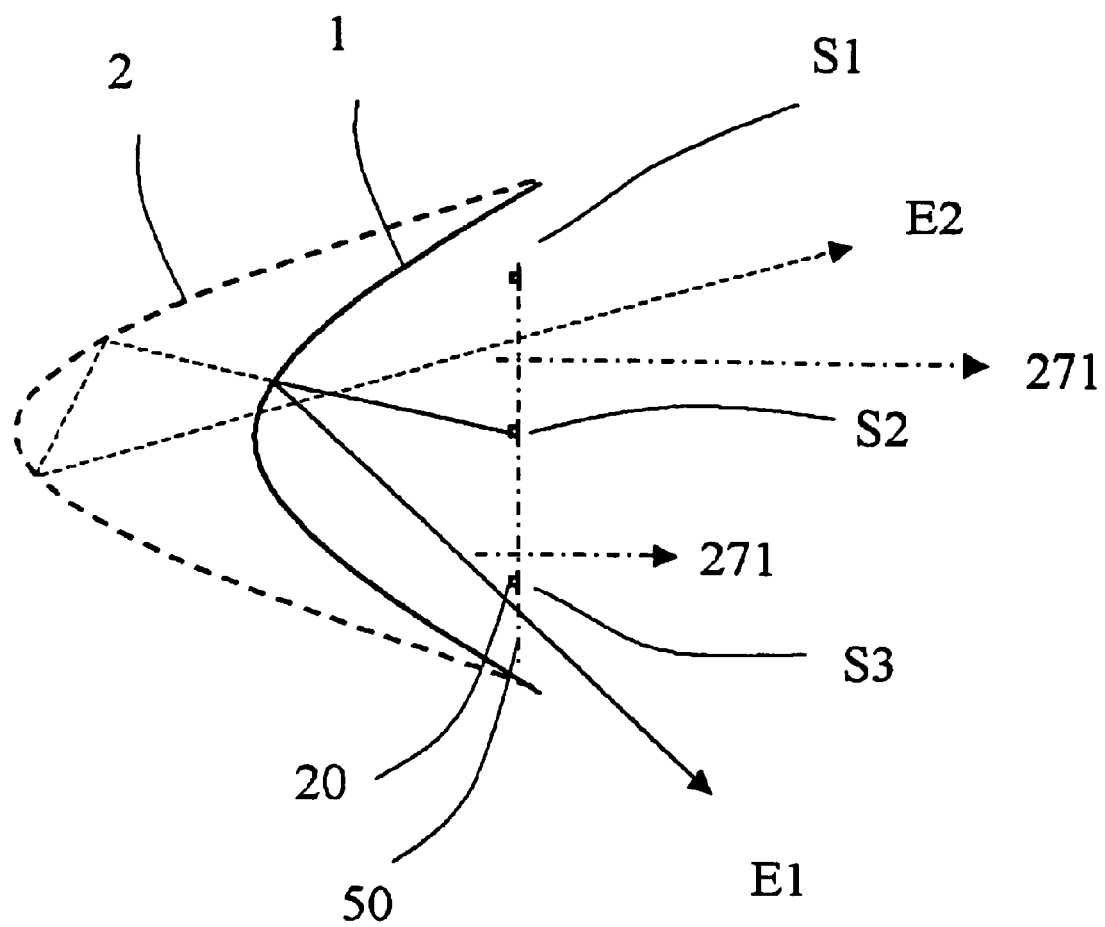
FIG. 3 shows a second embodiment of the present invention using a flexible reflecting cup.

FIG. 3 shows a second embodiment of the present invention. It is similar to FIG. 2, except that the reflecting cup 1 is made flexible. The cup 1 can be retracted backward as cup 2. Thus the reflections from cup 1, such as the reflected beam E1 of LED S2 from cup 1 through space 271 are different in direction from the reflected beam E2 of LED S2 from cup 2 through another space 271. Thus the radiation patterns are different.

Figure 4:
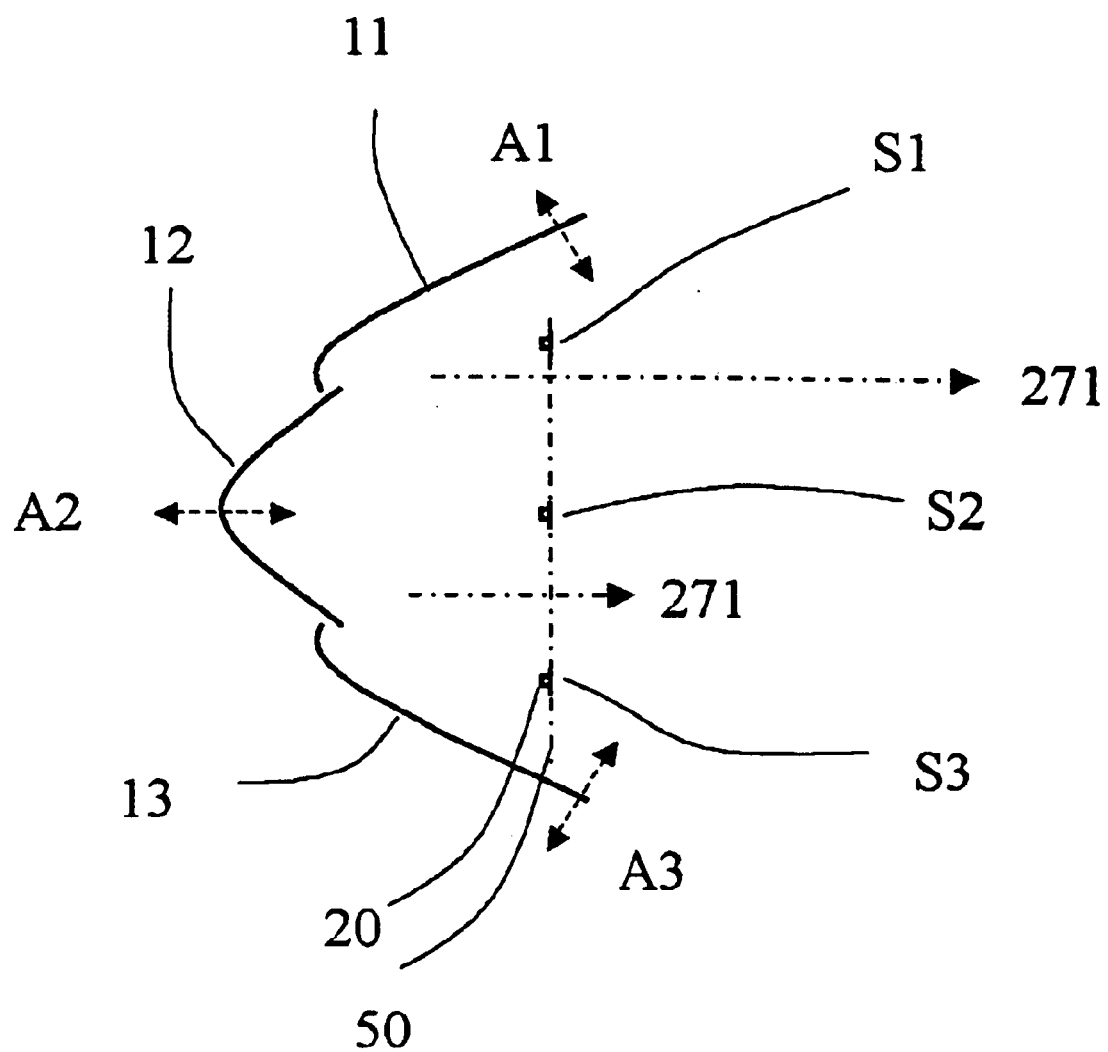
FIG. 4 shows a third embodiment of the present invention using two flexible reflectors.

FIG. 4 shows a third embodiment of the present invention. The difference from FIG. 2 is that the reflecting cup is replaced with two concentric flexible sections of a cup 12 and a skirt 11 or 13. The inner cup 12 can slide axially in the direction A2 with respect to the outer skirt 11 or 13. The outer section 11 can be bent in a direction A1 perpendicular to the surface 11, and the outer section 13 can be bent in a direction A3 perpendicular to the surface 13. The movement of the reflecting surfaces 11, 12, 13 can change the radiation pattern of the reflected light beams.

Figure 5:
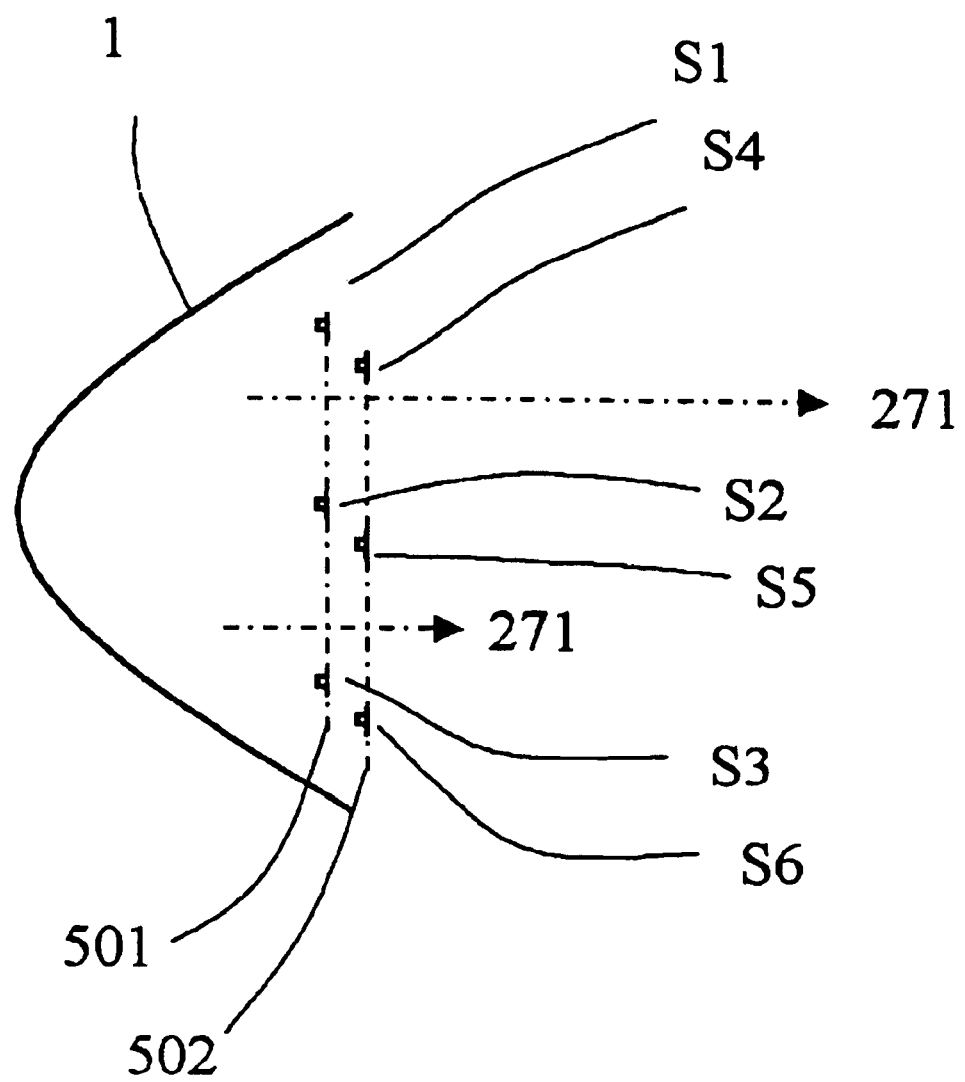
FIG. 5 shows a fourth embodiment using two LED panels as light sources for different colors

FIG. 5 shows a fourth embodiment of the present invention. There are two LEDs light panels 501 and 502. The LED panel 501 is mounted with LEDs S1, S2, S3. The LED panel 502 is mounted with LEDs S4, S5, S6, offset from LEDs S1, S2, S3 in the vertical direction, so that the lights emitted from the LEDs S4, S5, S6 in panel 502 are not blocked by the LEDs S1, S2, S3, respectively, but beam through the spaces 271 toward the reflecting cup 1. Each LED panel can provide single color LEDs or mixed-color LEDs. When all the LED panel provide same color lights, the multiple panels can provide a stronger light. When each panel has multiple color light LEDs, the two or more LED panels can be timed to light up at different times to produce a decorative effect.

Figure 6:
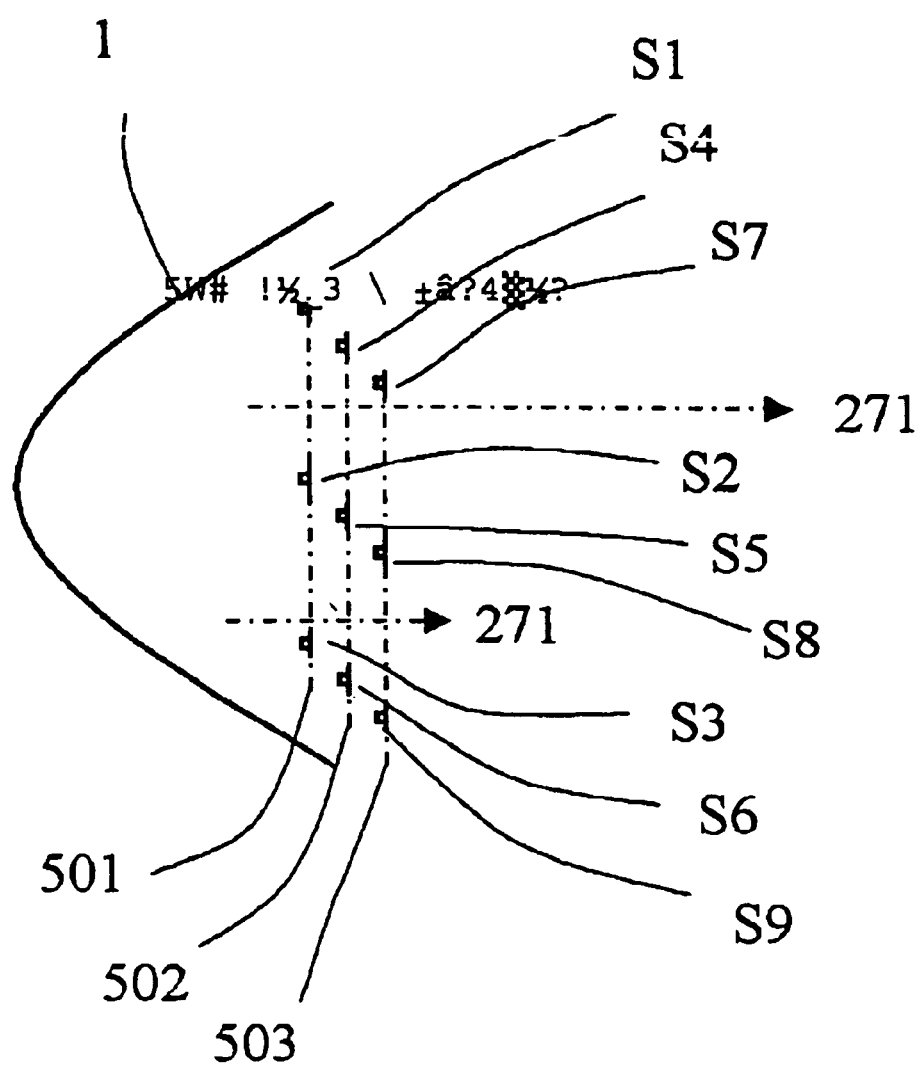
FIG. 6 shows a fifth embodiment using three LED panels as light sources.

FIG. 6 shows a fifth embodiment of the present invention. Three matrix array LED panels are stacked horizontally, with a red LED panel 501, a green LED panel 502 and a blue LED panel 503. The LED panel 501 is mounted with point LEDs S1, S2, S3; the LED panel 502, with LEDs S4, S5, S6; and panel 503, with LEDs S7, S8, S9. The LED are offset from each other vertically; so that the light emissions from S4, S5, S6, S7, S8 and S9 are not blocked when reflected from the reflecting cup 1 and radiating through the spaces 271. Using circuit control, the panels can provide single color light, combination of two color-lights, or combination of three-color light as white light. The lights can also be made to flash.

Figure 7:
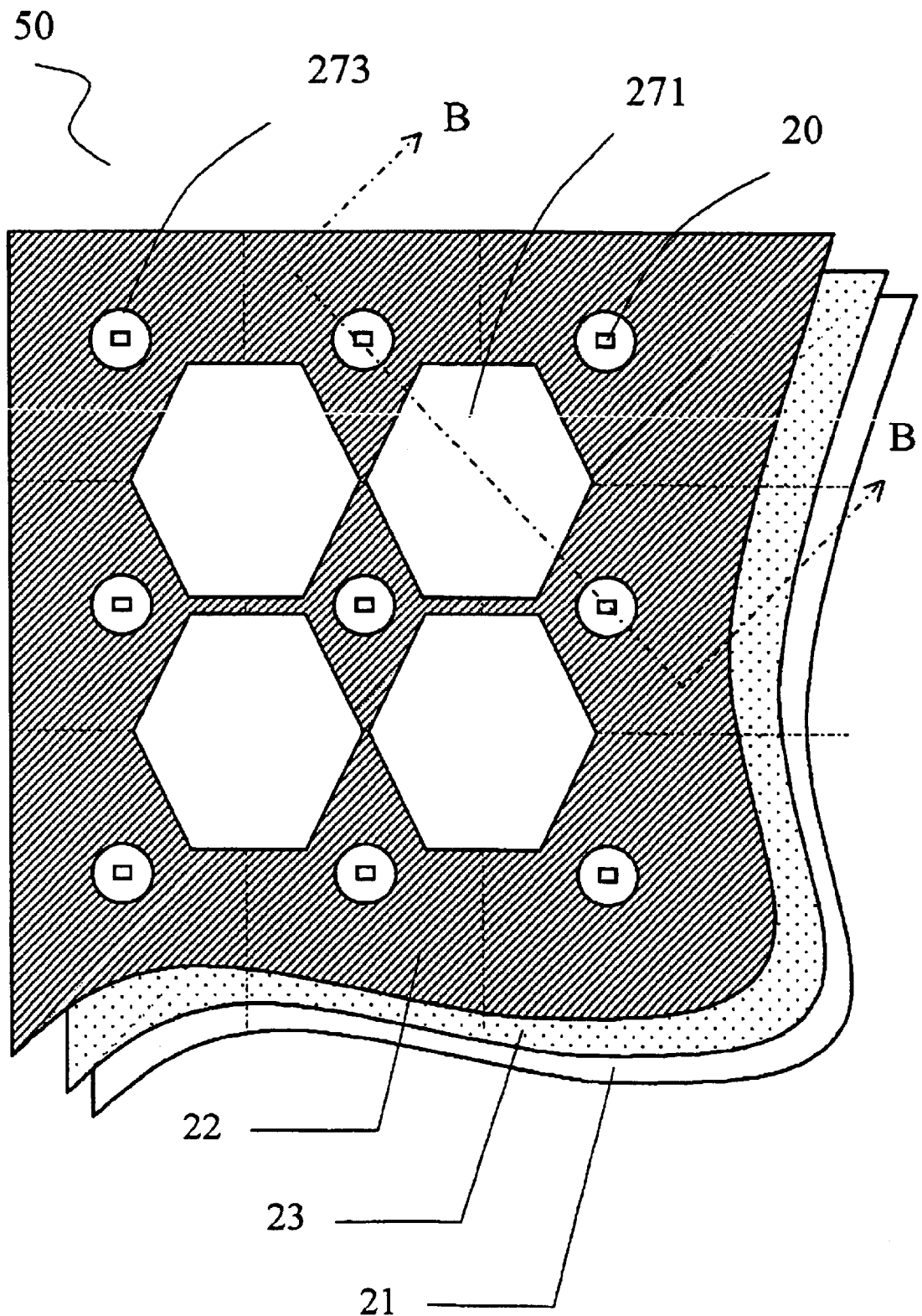
FIG. 7 shows front view of the LED panel shown in FIG. 2.

FIG. 7 shows a first version of LED panel structure, for the LED panel 50 shown in FIG. 2. The LEDs 20 are mounted on a metal plate 21 and protruded through a second perforated metal plates 22, which is isolated from metal plate 2 through an insulating layer 23. Both metal plates have window spaces 271 for light passage and air circulation. The second metal plate 22 further have smaller through holes 273, through which the LEDs 20 can protrude.

Figure 8:
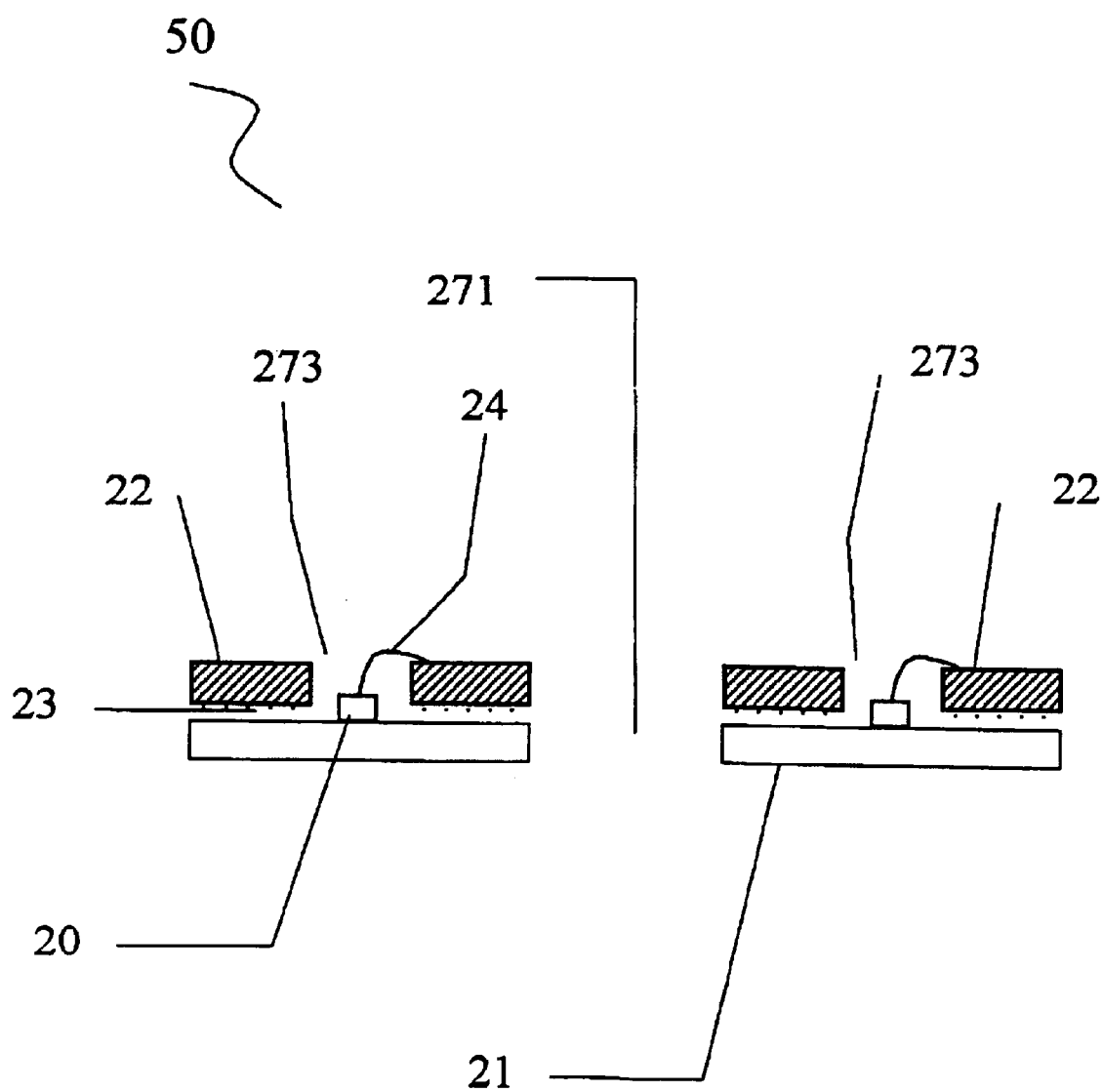
FIG. 8 shows the cross-section view of the LEDs in the panel.

FIG. 8 shows a cross-section view along the section line BB of FIG. 7. The LEDs 20 each with a bottom electrode are mounted on the first metal plate 21. The LEDs 20 are protruded through the through holes 273 in the second metal plate 22, which is insulated from the first metal plate 21 by an insulating layer 23. The top electrodes of the LEDs are wire-bonded to the second metal plate 22.

Figure 9:
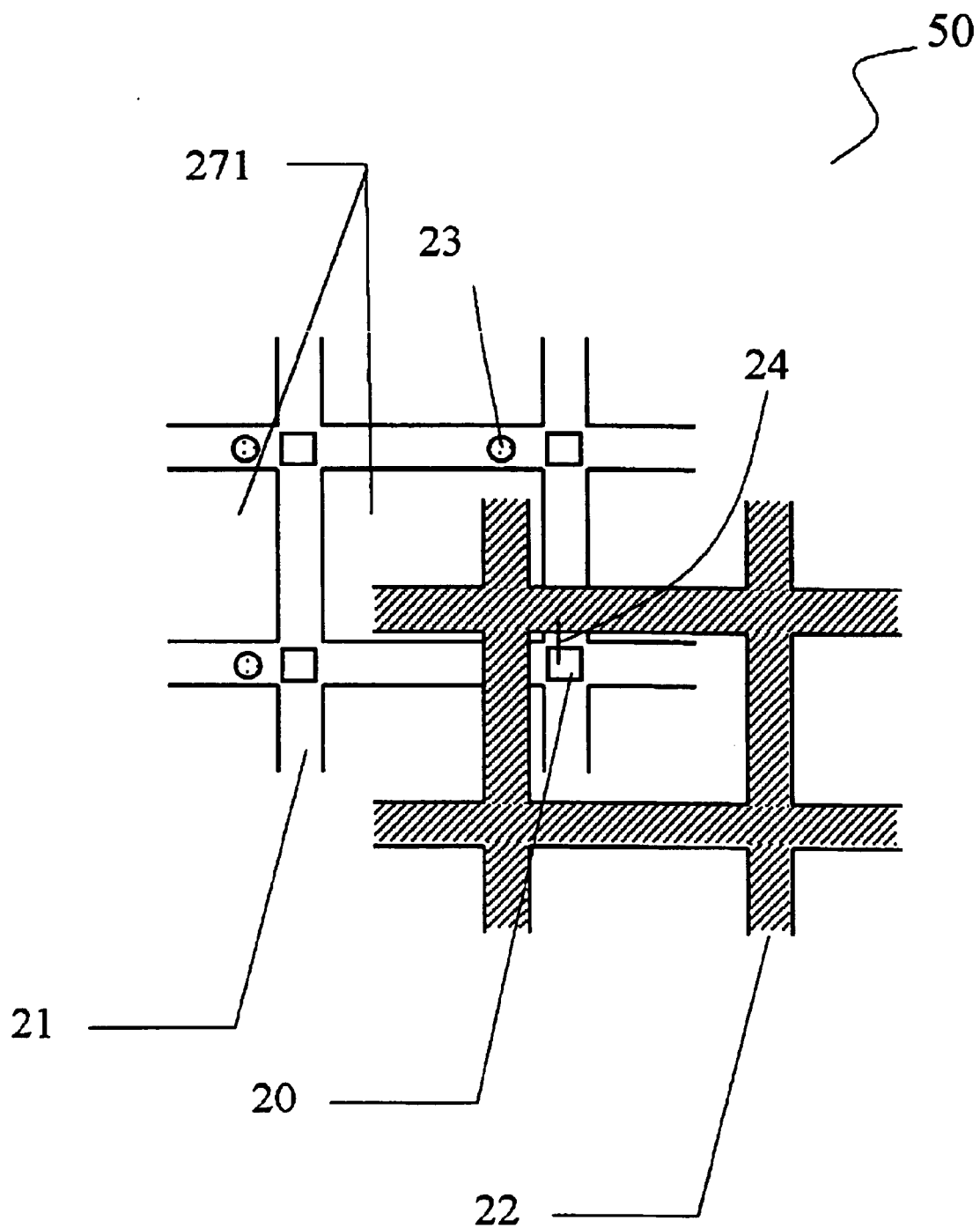
FIG. 9 shows a second embodiment of the LED panel structure.

FIG. 9 shows a second version of the LED panel 50 structure shown in FIG. 2. The metal plate 21 and metal plate 22 both have a grid pattern, offset from each other. The LEDs each with a bottom electrode are mounted on the metal grid 21 at the cross-points of the ridges of the grid. The second metal grid 22 is slightly offset from the grid pattern of the metal plate 21, so that the top electrodes of the LEDs can protrude through the windows 271 of the metal grid 22 near the cross-points of the metal plate 21 where the LEDs are mounted. The top electrodes of the LEDs are then wire-bonded by wires 24 to the metal grid 22. The insulating material 23 is inserted between metal grid 21 and metal grid 22 to provide isolation. The windows 271 are for light passage and air circulation.

Figure 10:
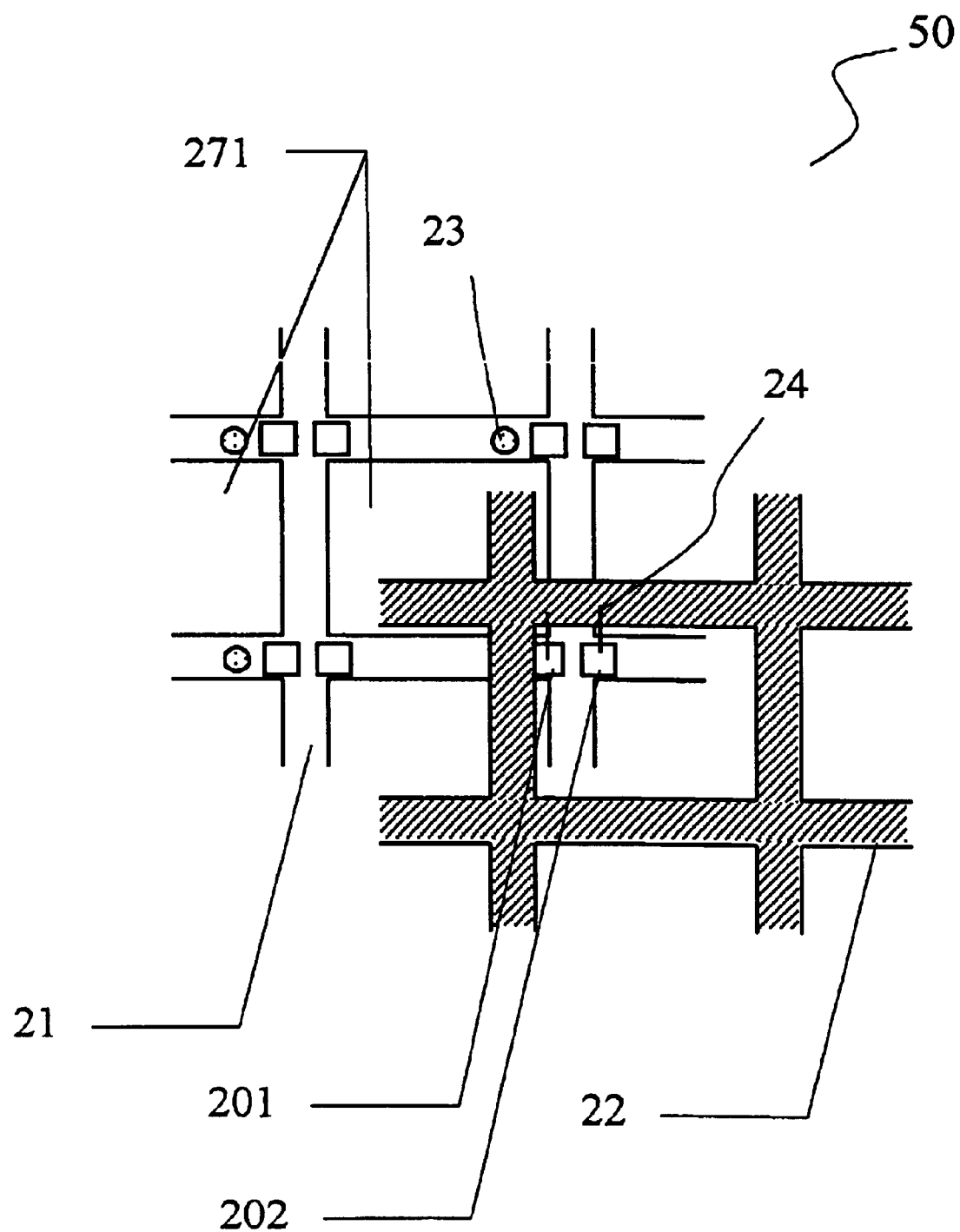
FIG. 10 shows a third embodiment of the LED panel structure.

FIG. 10 shows a third version of the LED panel 50 structure shown in FIG. 2. The structure is similar to FIG. 9 except that two LEDs 201, 202 are mounted near the cross-points of the ridges of the metal grid 21. Two wires 24 are used to wire-bond the two top electrodes of the LEDs to the metal grid 22 near the cross-points of metal grid 21. The windows 271 between the ridges of the grid are for light passage and air circulation. As in FIG. 9, insulating material 23 is inserted between grid 21 and metal grid 22 to provide isolation.

Figure 11:
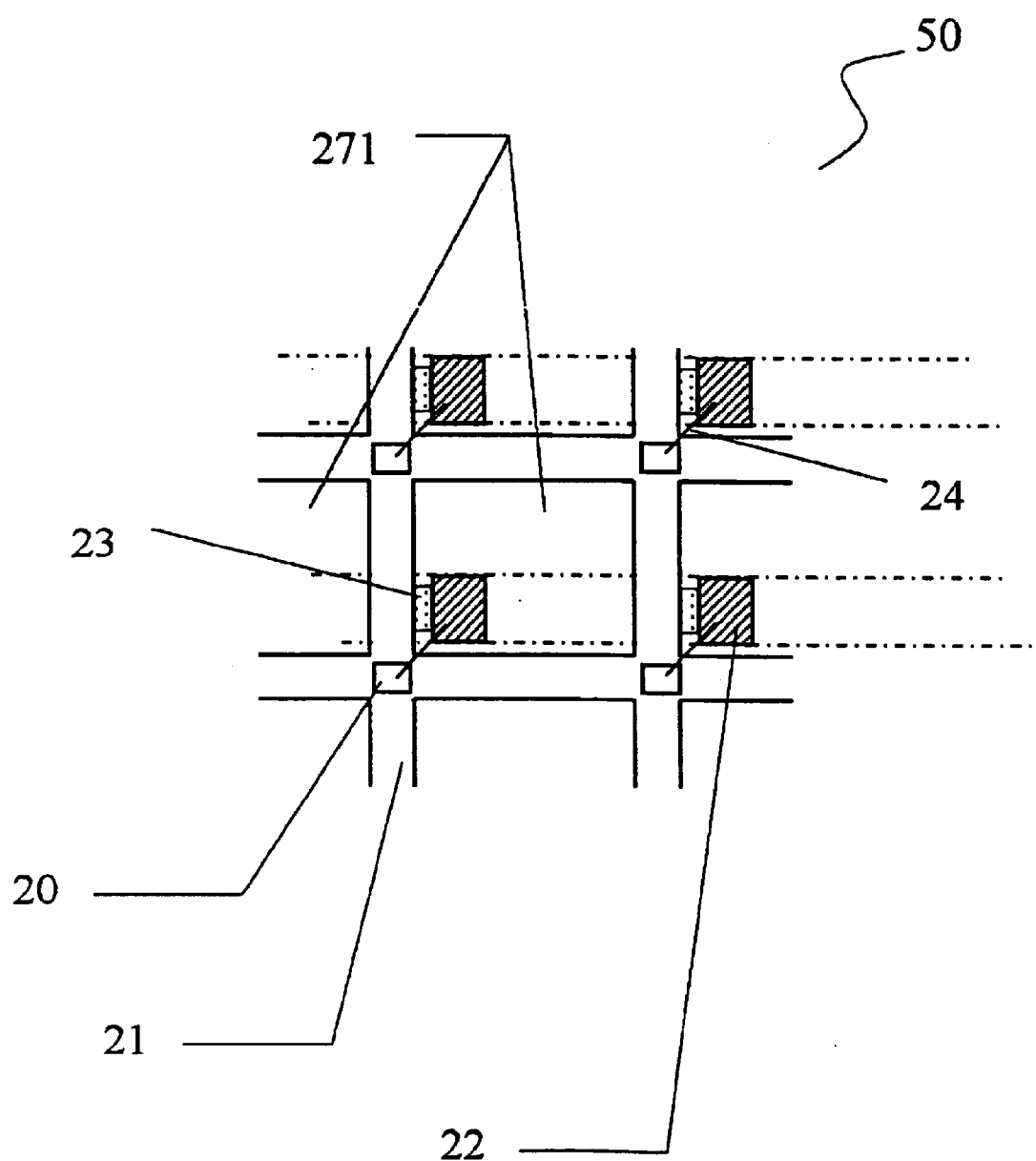
FIG. 11 shows a fourth embodiment of the LED panel structure.

FIG. 11 shows a fourth version of the LED panel 50 structure shown in FIG. 2. The first metal 21 has a grid pattern and is mounted with LEDs 20 each with a bottom electrode. The metal grid 21 overlays a number metal rows 22, parallel to the horizontal ridges of the grid 21 but offset from the grid. Each metal row has a number of pedestals near the cross-points of grid 21 for wire-bonding to the top electrodes of the LEDs 20. The pedestal are isolated from the metal grids 21 by means of insulators 23. The air spaces 271 between the ridges of the grid are for light passage and air circulation.

Figure 12:
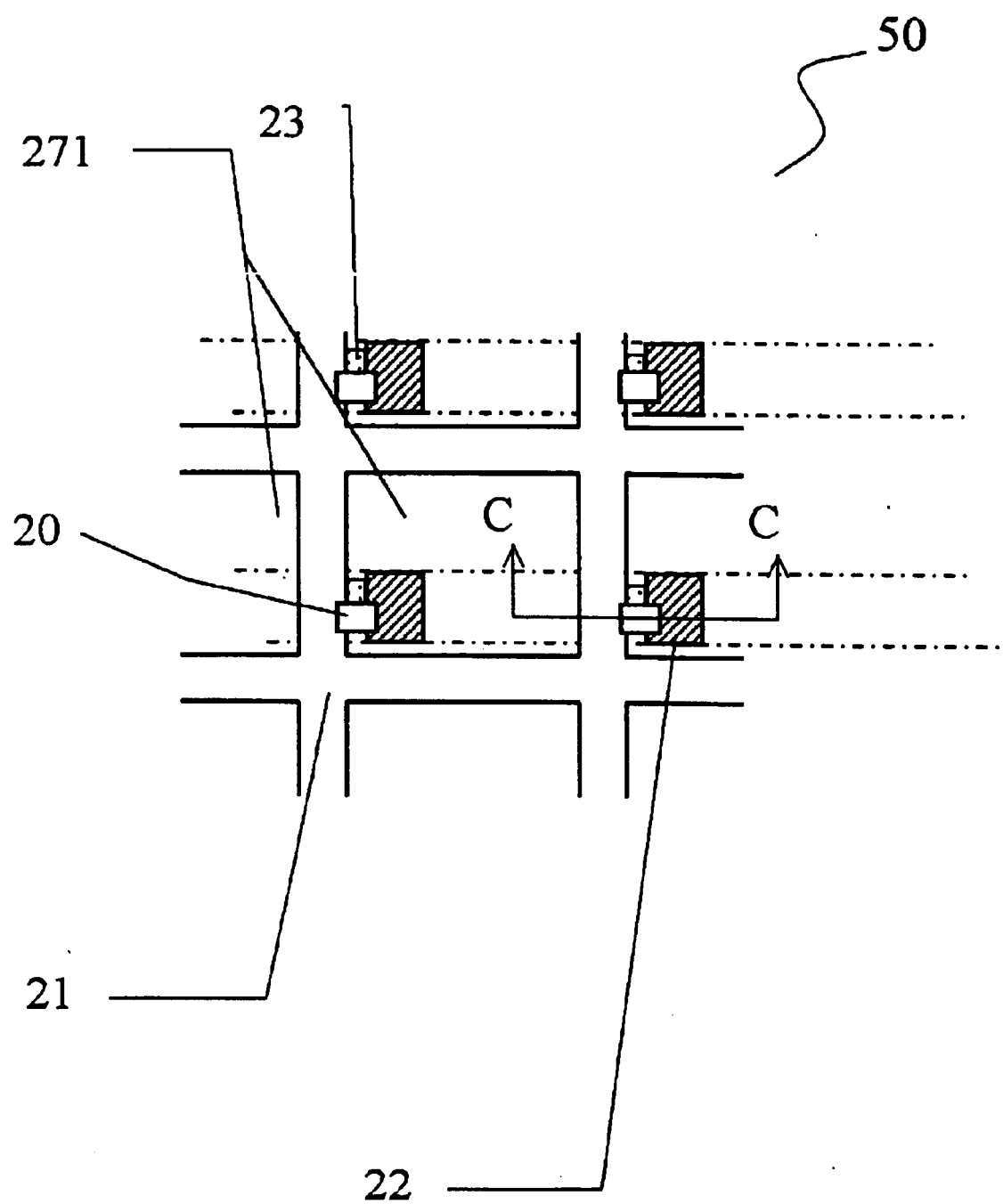
FIG. 12 shows a fifth embodiment of the LED panel structure.

FIG. 12 shows the fifth version of LED panel 50 structure shown in FIG. 2. The layout is similar to that in FIG. 11, except that each LED has two bottom electrodes. Instead of wire-bonding, the two bottom electrodes straddle over the metal grid 21 and the pedestals on metal rows 22 for electrical connection. The windows 271 between the ridges of the metal grid 21 is for light passage and air circulation.

Figure 13:
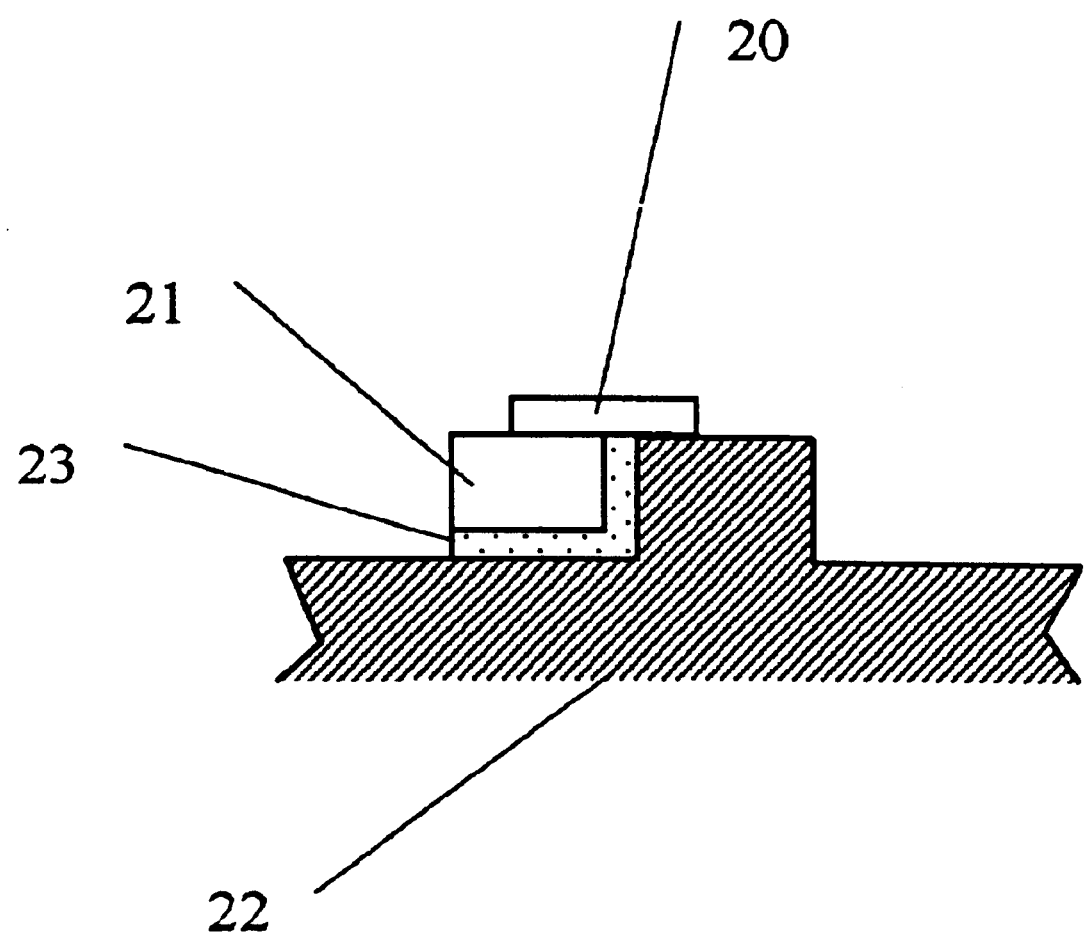
FIG. 13 shows a section view of FIG. 12.

FIG. 13 shows the cross-section view of FIG. 12 along the section line CC. The ridge of metal grid 21 overlays the metal row 22. The pedestal of the metal row 22 is planar to the metal ridge of the grid 21, and isolated from each other by insulator 23. The two bottom electrodes of each LED 20 straddle over the grid 21 and the pedestal 22.

Figure 14:
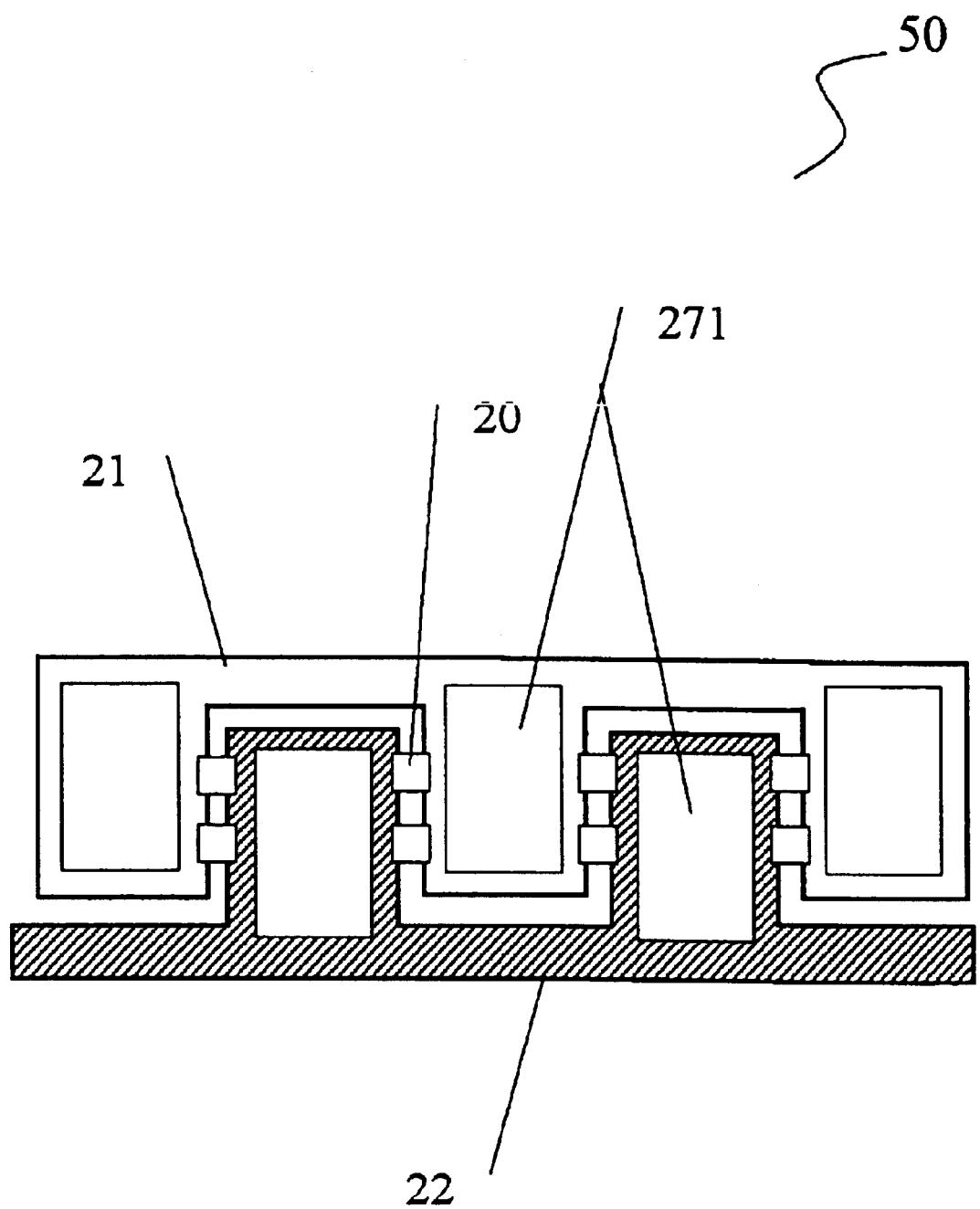
FIG. 14 shows a sixth embodiment of the LED panel structure.

FIG. 14 shows a sixth version of the LED panel 50 structure shown in FIG. 2. The layout of the metal plate 21 and metal plate 22 in FIG. 2 are interdigital. The structure is for LEDs 20 with two bottom electrodes, which straddle over the interdigital metal teeth. Between the teeth are windows 271 for light passage and for air ventilation to lower the operating temperature. The structure can be extended by increasing the number of teeth to form a row of the LED matrix array.

Figure 15:
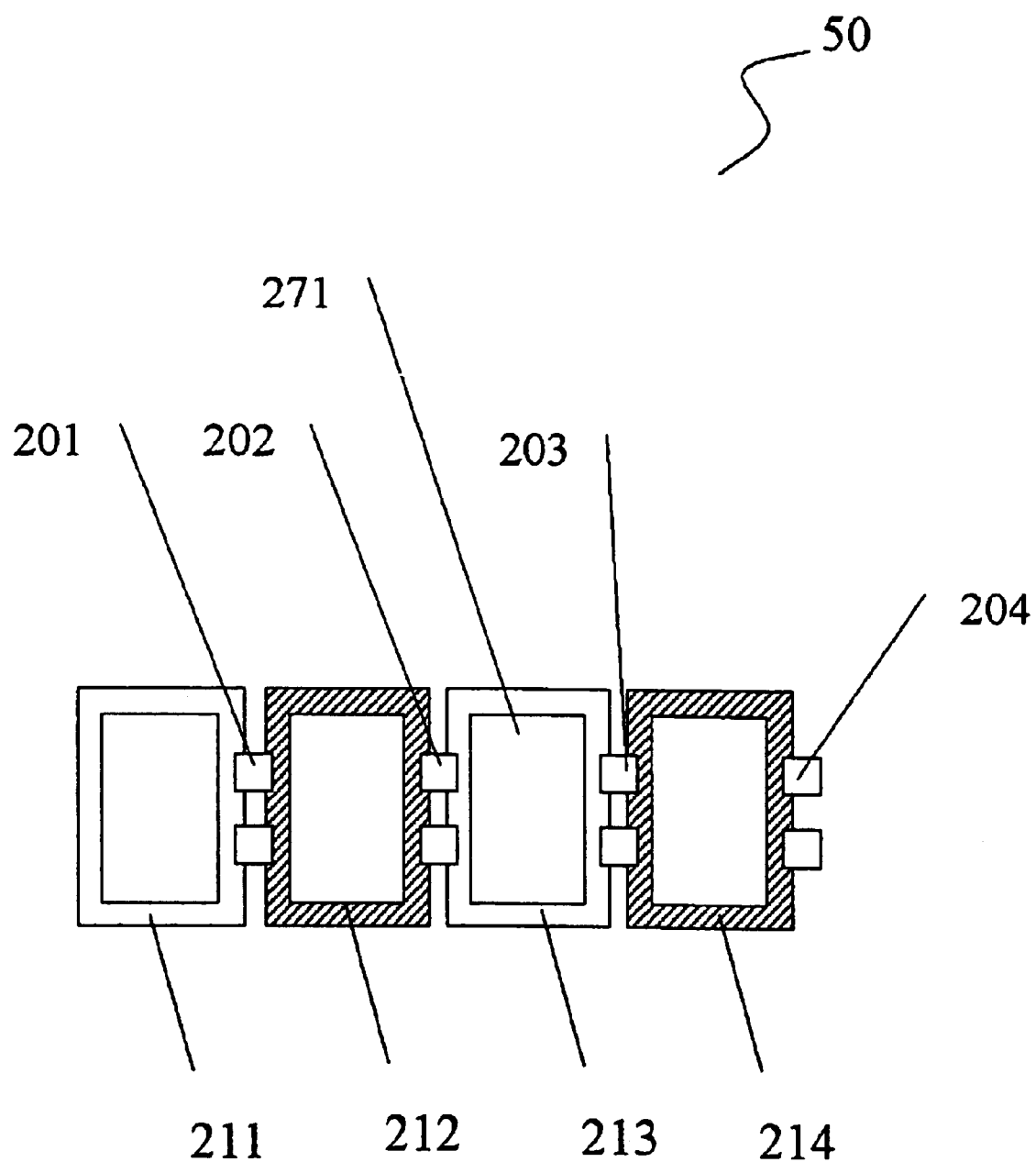
FIG. 15 shows a seventh embodiment of the LED structure.

FIG. 15 shows a seventh version of the LED panel 50 structure shown in FIG. 2. The LEDs all have only bottom electrodes, straddling between two adjacent rectangular metal frames. The LEDs are in parallel-series connections electrically. Two parallel LEDs 201 straddle between adjacent metal frames 211 and 212; two parallel 202 straddle between adjacent metal frames 212 and 213; two parallel LEDs 203 straddle between adjacent metal frames 213 and 214, and so forth. The LEDs 201, 202, 203 and 204 are electrically connected in series. The windows 271 in each metal frame are for light passage and air circulation. The pattern of the frames can be many more times to form a row of the LED matrix array.

Figure 16:
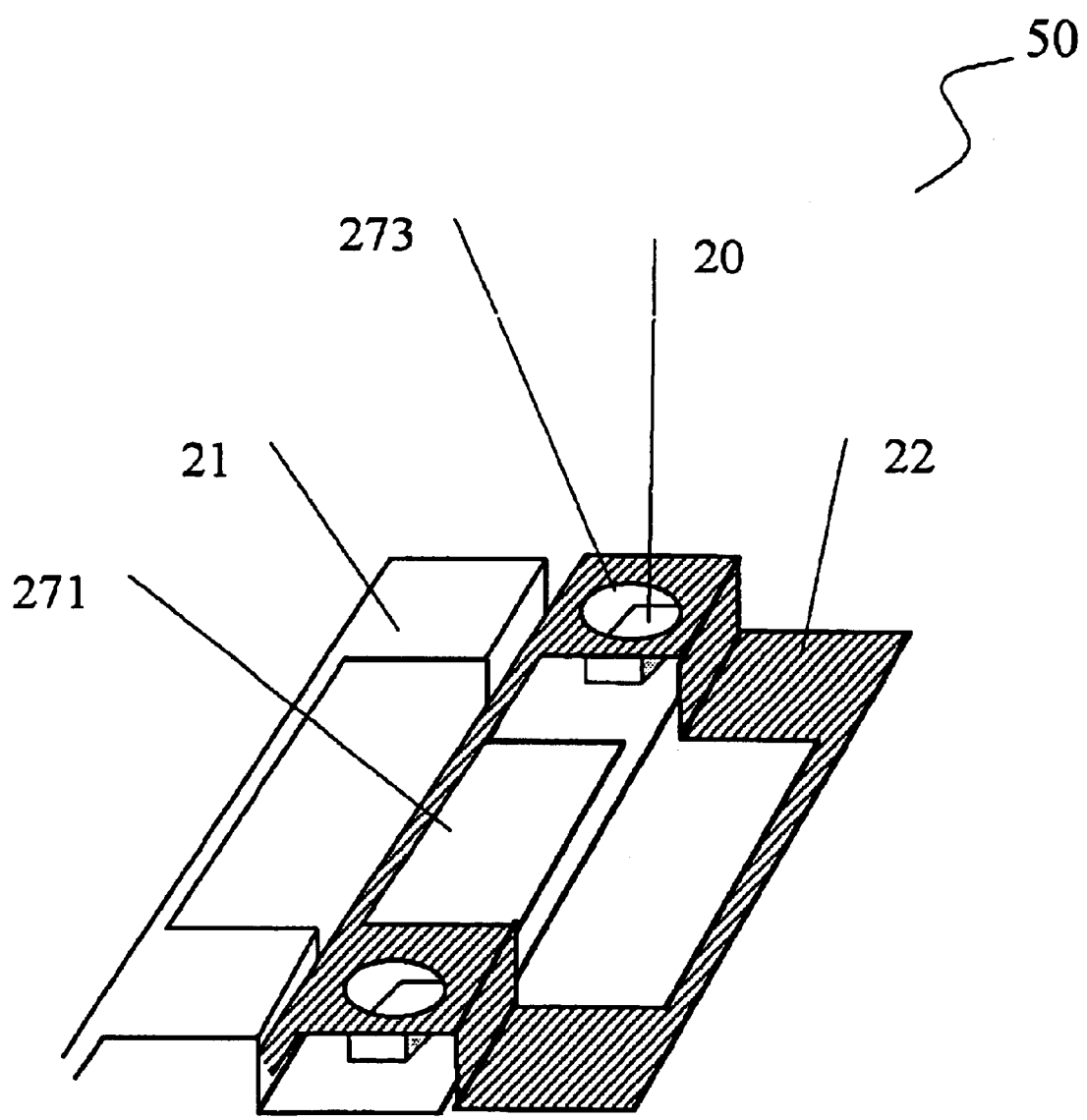
FIG. 16 shows an eighth embodiment of the LED structure.

FIG. 16 shows an eighth version of the LED panel 50 structure shown in FIG. 2. Each LED 20 has a top electrode and a bottom electrode. The LEDs are mounted on the lower flange of a first Z-shaped metal plate 21. A second Z-shaped metal plate 22 has its upper flange overlaying the lower flange of the first Z-shaped metal plate 21 but exposing the top electrode of the LED 20 through a window 273 for wire-bonding or direct contacting the top electrode of the LED 20 to the upper flange of the Z-shaped metal plate 22. The lower flange of the second metal plate 22 can mount another set of LEDs (not shown). The Z-shaped metal sections can repeat linearly many times to form a row of the LED matrix array. In this manner, the LEDs can be in parallel-series connection electrically. Both the first metal plate and the second metal plate have large window spaces 271 between the LEDs for light passage and for air circulation.

Figure 17:
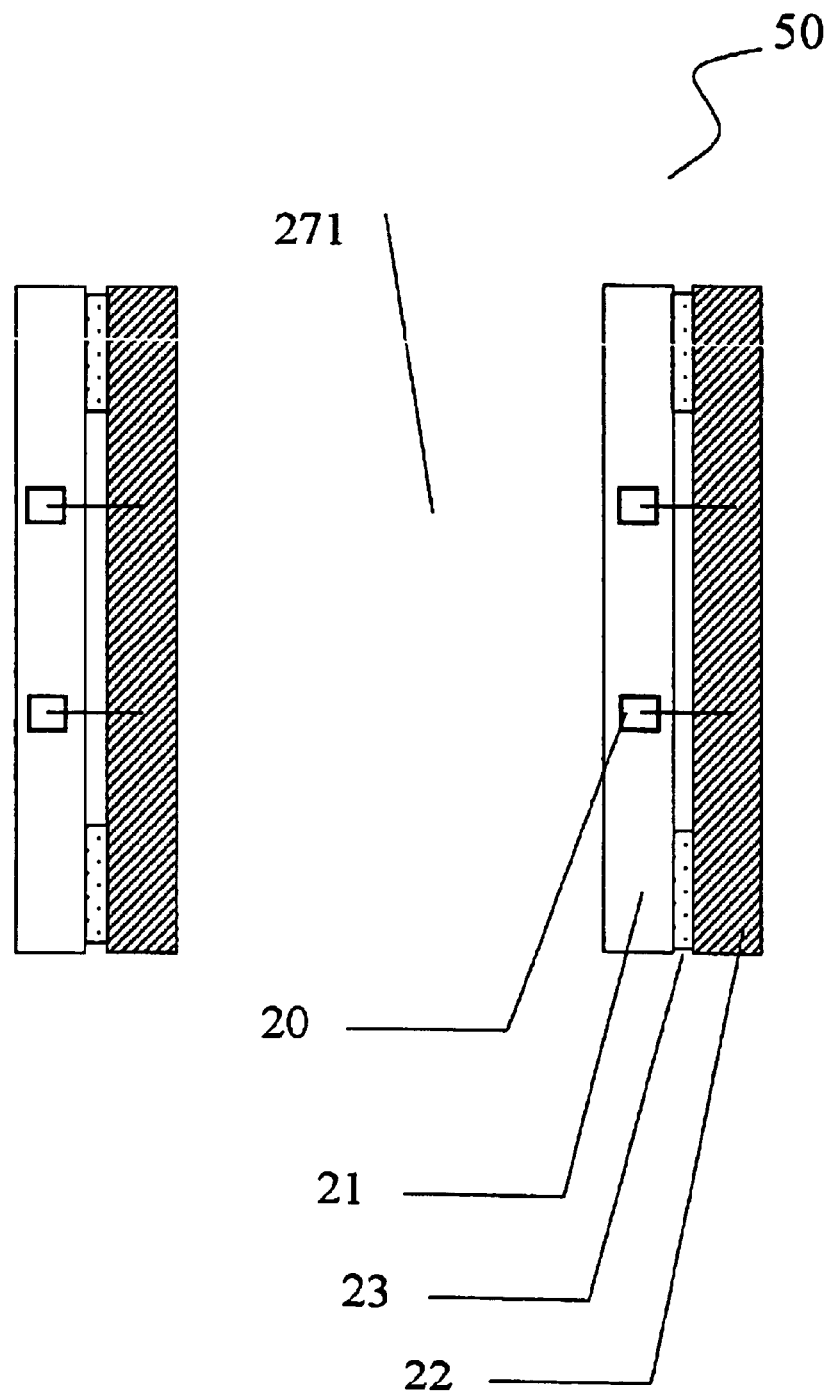
FIG. 17 shows a ninth embodiment of the LED structure.

FIG. 17 shows a ninth version of the LED panel 50 structure shown in FIG. 2. Each LED 20 has a top electrode and a bottom electrode. The LEDs 20 of each light cell are mounted on a metal rail 21, and the top electrodes of the LEDs 20 are wire-bonded to a parallel metal rail 22, separated from metal rail 21 by thin insulators 23. Adjacent sets of parallel metal rails 21/22 are separated by air spaces 271 for light passage and for air circulation. The two-LED section shown in FIG. 17 can be repeated many times to form a column of the LED matrix array.

Figure 18:
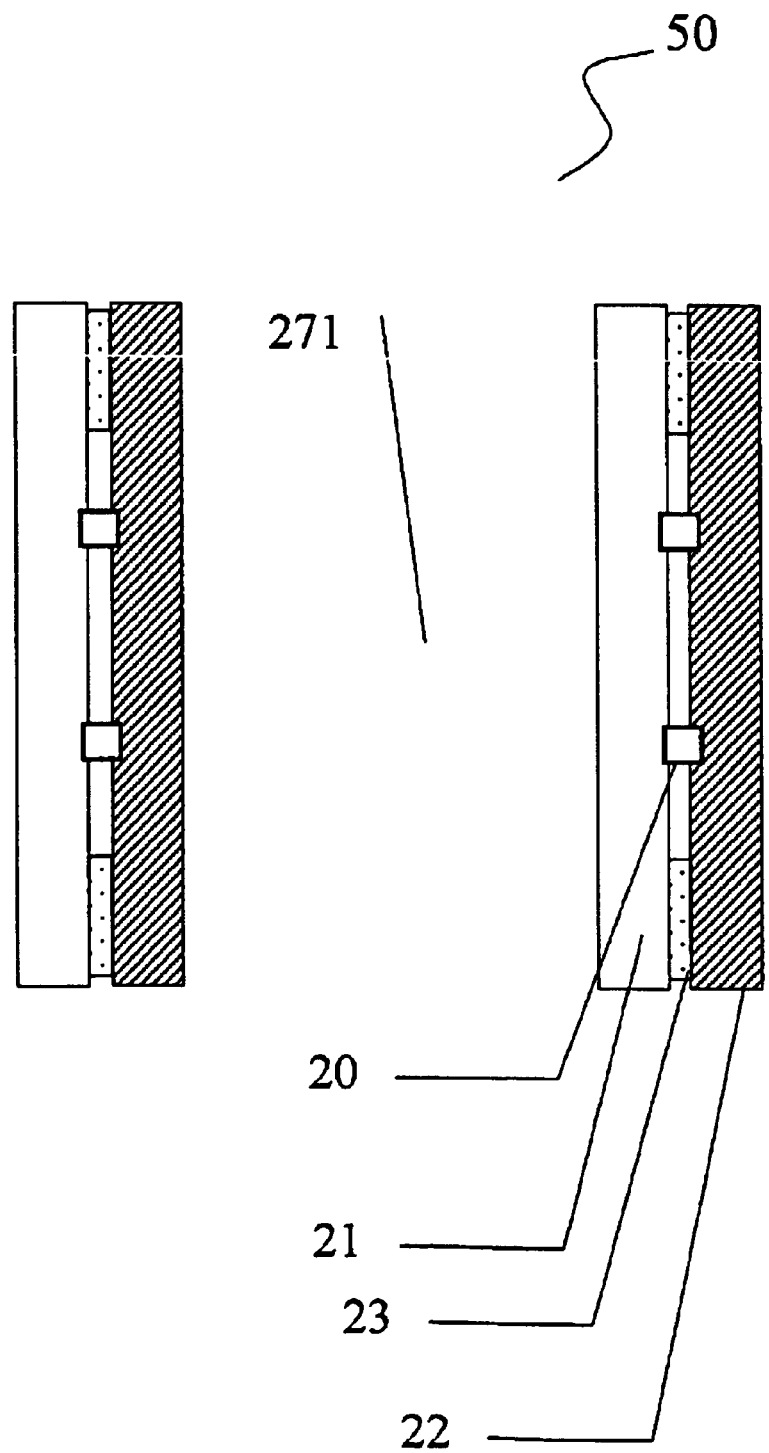
FIG. 18 shows a tenth embodiment of the LED structure.

FIG. 18 shows a tenth version of the LED panel 50 structure shown in FIG. 2. Each LED has two bottom electrodes, straddling between a first metal rail 21 and a parallel metal rail 22 which are separated from each other by insulators 23. Adjacent sets of parallel metal plates 21/22 are separated by air spaces 271 for light passage and for air circulation. The 2-LED section shown in FIG. 18 can be repeated many times to form a column of the LED matrix array.

Figure 19:
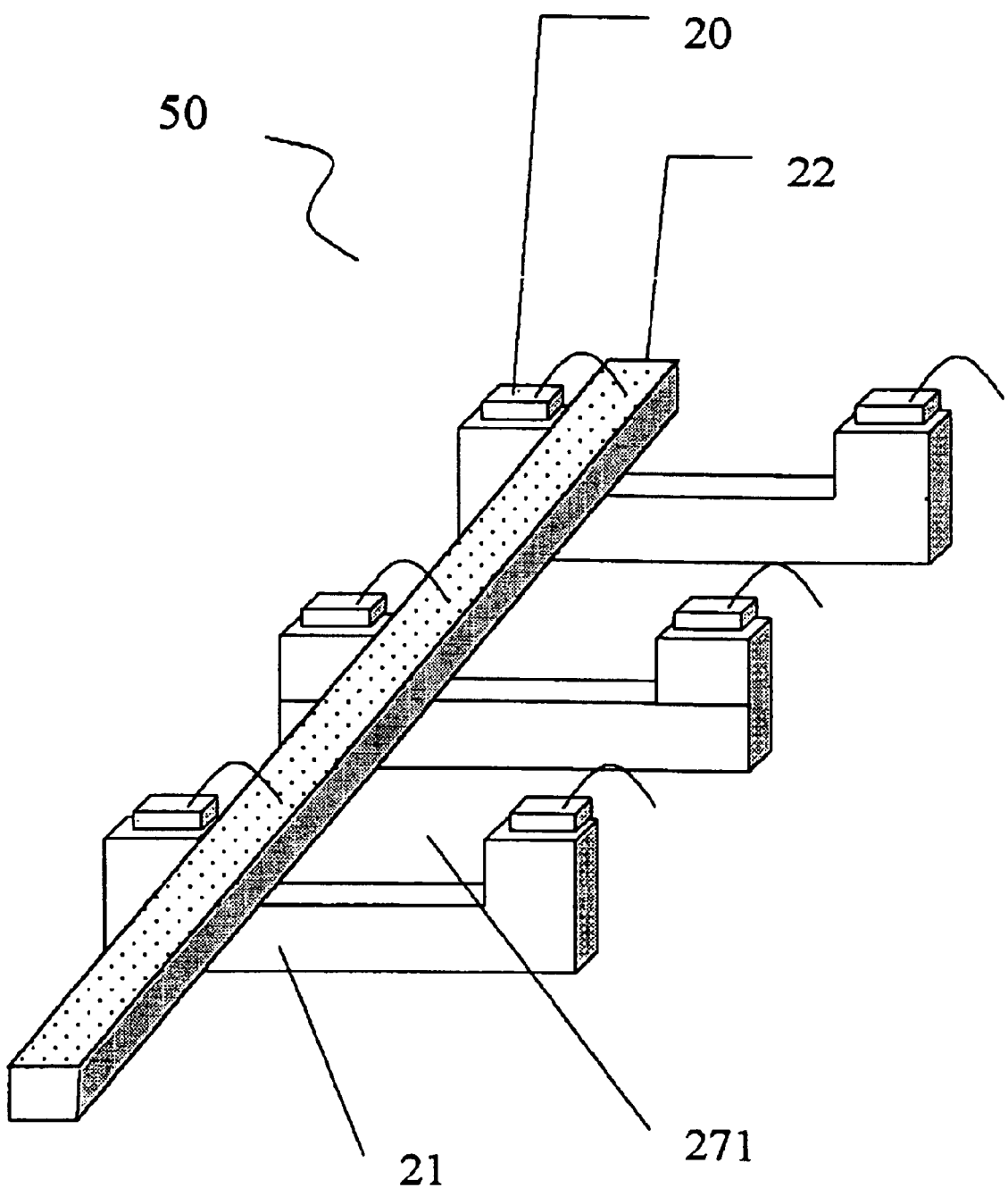
FIG. 19 shows an eleventh embodiment of the LED panel structure.

FIG. 19 shows an eleventh version of the LED panel 50 structure shown in FIG. 2. Each LED has a top electron and a bottom electrode. The LEDs are mounted on the pedestals of parallel metal brackets 21. The top electrodes are wire-bonded to a metal rail 22 lying over, but insulated from the recesses of brackets 21. The metal brackets 21 are separated by air spaces 271 for light passage and for air circulation. The number of brackets shown in FIG. 19 can be increased many times to form a column of the LED matrix array.

Figure 20:
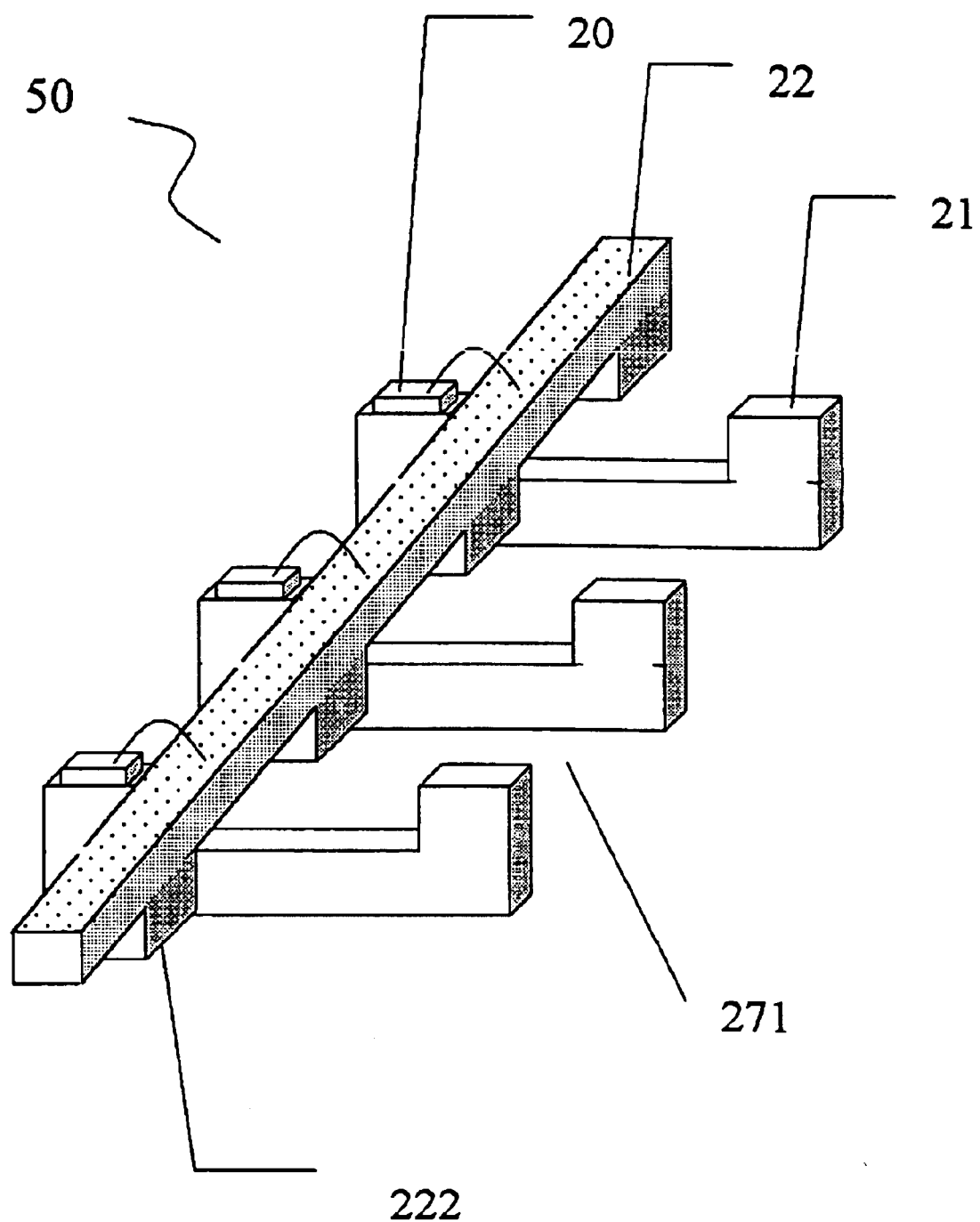
FIG. 20 shows a twelfth embodiment of the LED panel structure.

FIG. 20 shows a twelfth version of the LED panel 50 structure shown in FIG. 2. The structure is similar to that in FIG. 19 except that the metal rails 22 have vertical extensions 222 for heat sinking.

Figure 21:
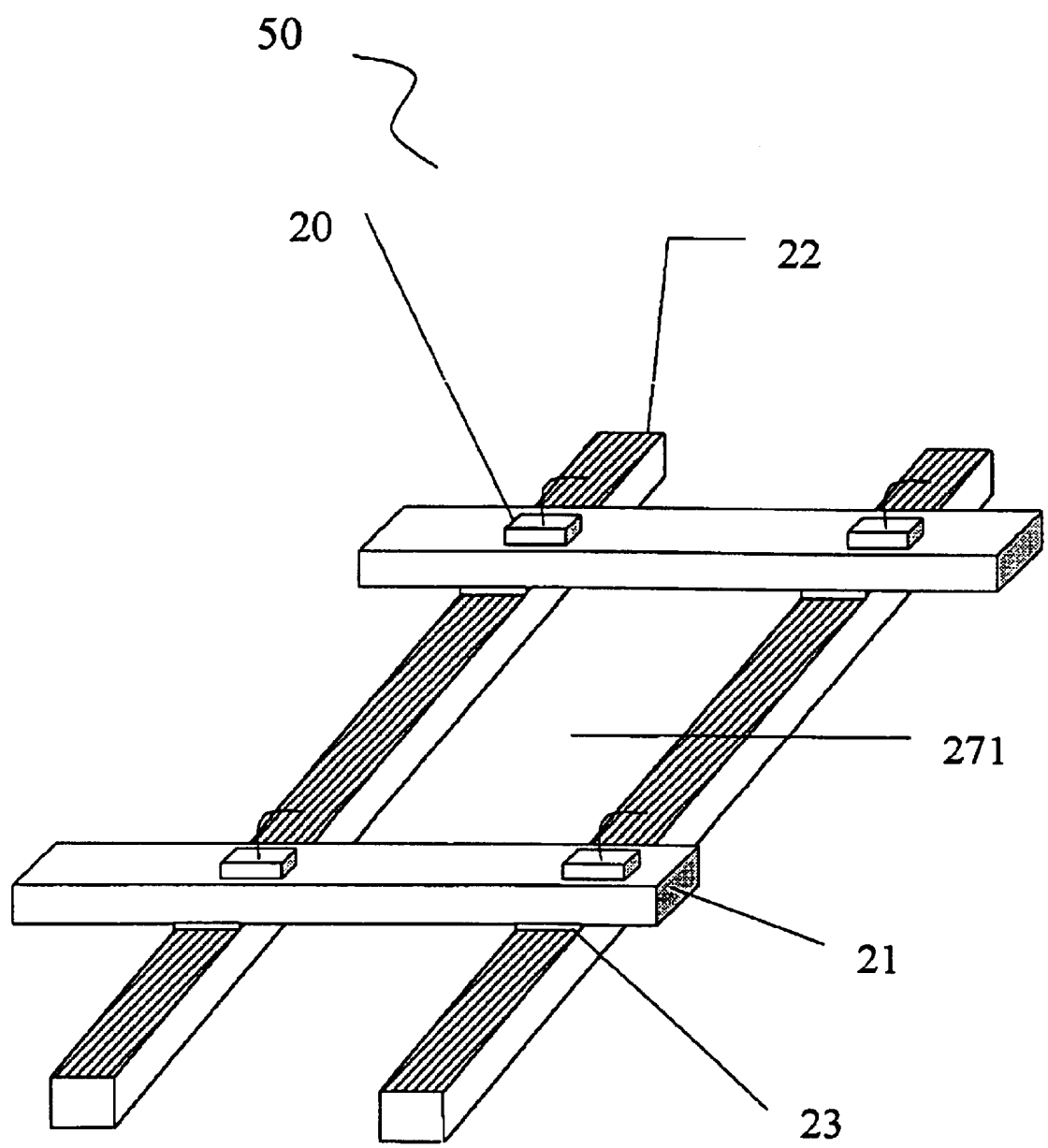
FIG. 21 shows a thirteenth embodiment of the LED panel structure.

FIG. 21 shows a thirteenth version of the LED panel 50 structure shown in FIG. 2. Each LED has a top electrode and a bottom electrode. The LEDs 20 are mounted on parallel metal bars 21, which rest through insulators 23 on a set of orthogonal parallel metal rails 22. The top electrodes are wire bonded the metal rails 22. Air spaces 271 between the first set of metal rails 21 and the second set of metal rails 22 are provided for reflected light to pass and for air circulation. The number of parallel bars 21 and number of parallel rails can be increased to form the LED matrix array.

While the foregoing first through thirteenth versions of the LED 50 structure are described for FIG. 2, the structures should be also applicable to the first through fifth embodiments of the light source.

Figure 22:
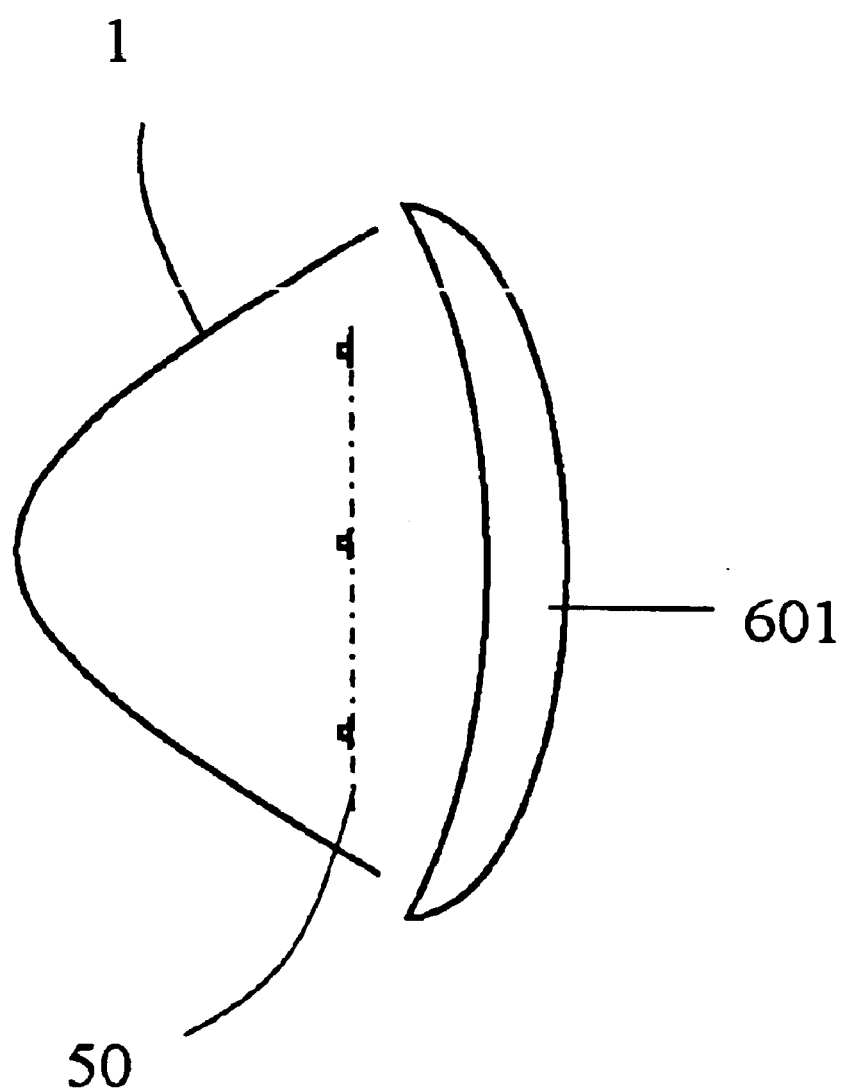
FIG. 22 shows a lens for the LED light source.

FIG. 22 shows the addition of a lens 601 to cover the front of the reflecting cup shown in FIG. 2. With a different lens 601, the lens can focus, diverse or constrict the reflected light.

Figure 23:
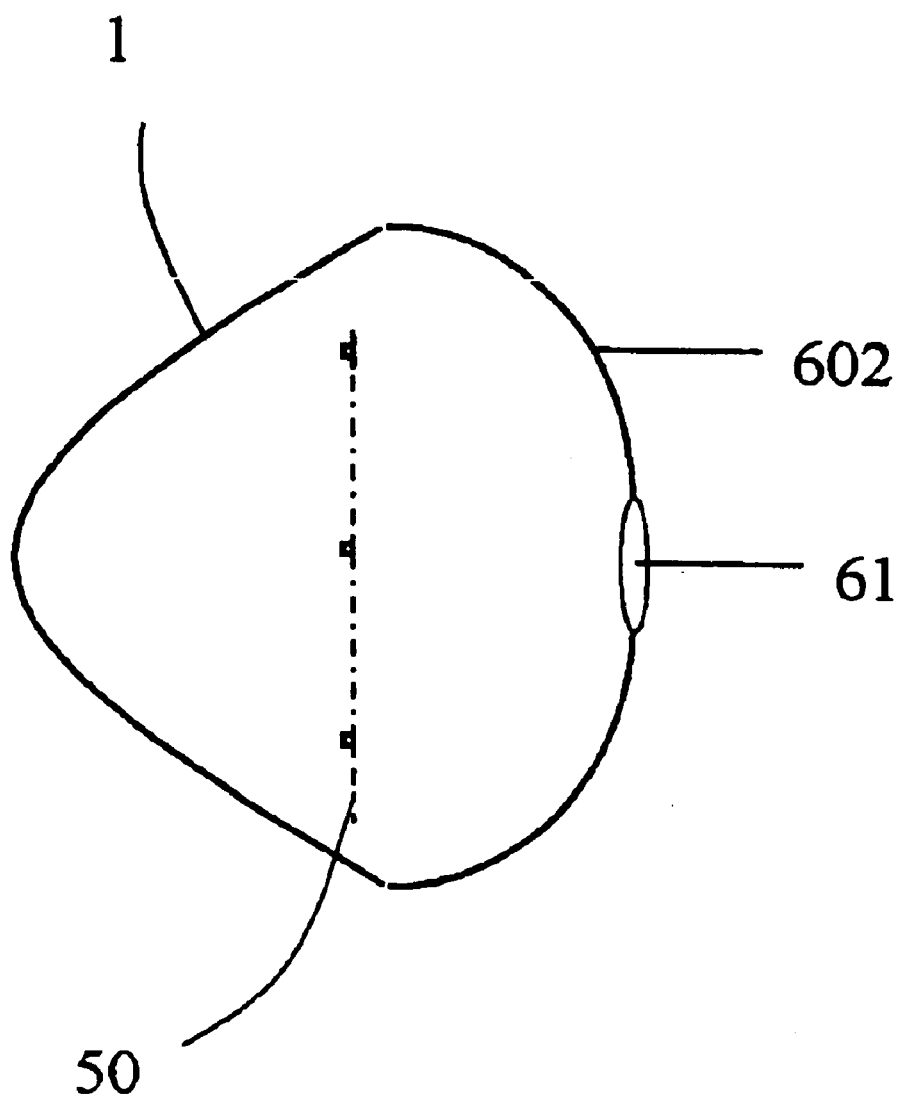
FIG. 23 shows a cover for the LED light source with a window.
Figure 24:
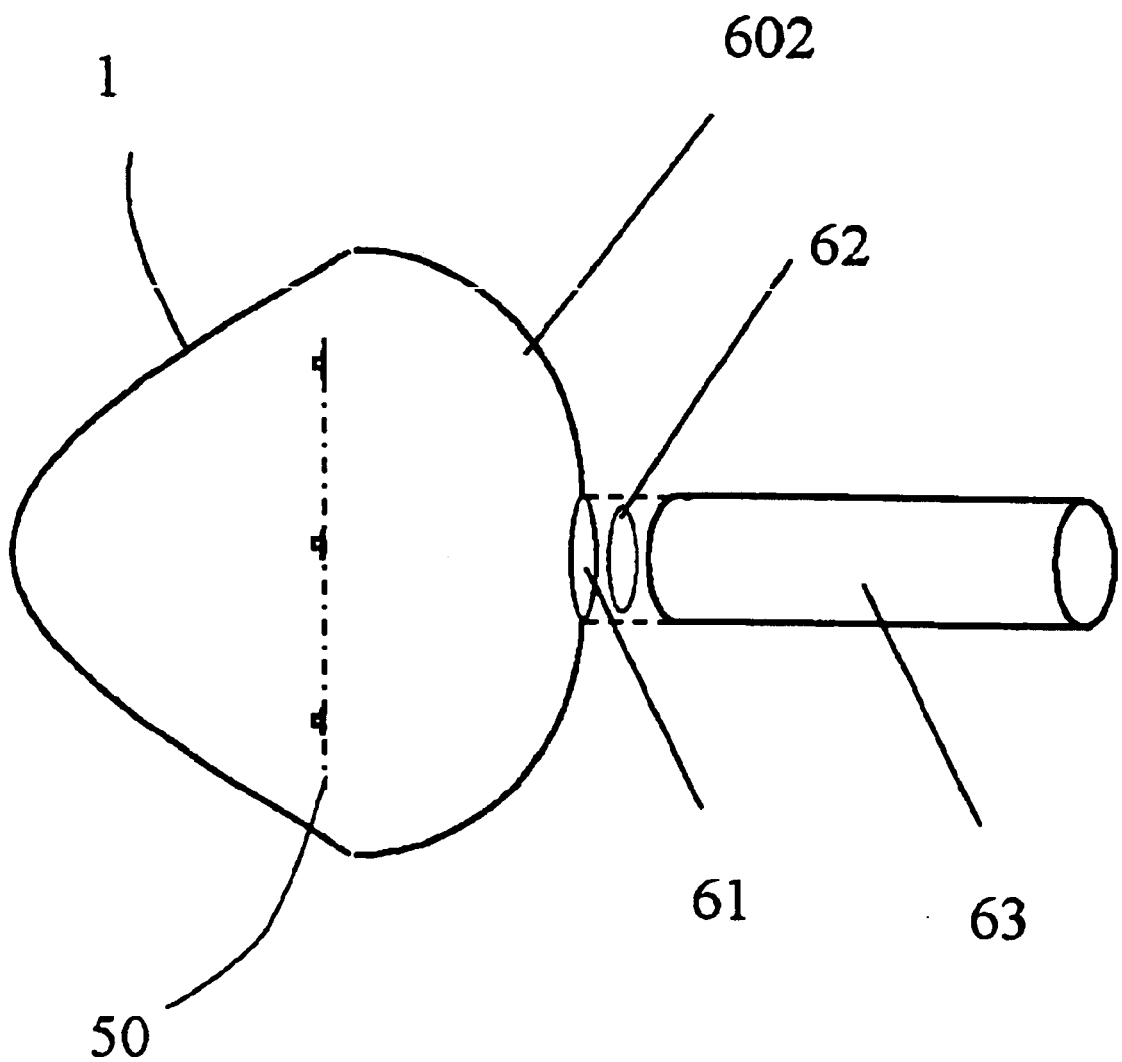
FIG. 24 shows a light guide for the LED light source.

FIG. 23 shows a cover 602 placed in front of the reflecting cup shown in FIG. 2. The cover has a window 61. The inner surface of the cover 602 is coated with light reflecting material to increase the light intensity radiating from the window 61. The window 61 can be coupled to the light cable 63 as shown in FIG. 24 for transmission of the reflected light from the reflecting cup 1. A lens 62 may be inserted between the light window 61 and the light cable 63. The other end of the light cable can serve for illumination, decoration, etc.

While the preferred embodiments of the invention have been described, it will be apparent to those skilled in the art that various modifications may be made without departing from the spirit of the present invention. Such modifications are all within the scope of this invention.

What is claimed is:

1. A light source for projection, comprising:
a matrix array of light emitting diodes (LED);
at least one panel for mounting said LEDs;
a reflector for reflecting emitted light from said LEDs, and spaces between said LEDs for light passage,
wherein said reflector is flexible so that the reflection of the emitted light from each one of said LEDs can change direction, and
wherein the reflector has an inner cup and an outer jacket.

2. A light source for projection, comprising:
a matrix array of light emitting diodes (LED);
at least one panel for mounting said LEDs;
a reflector for reflecting emitted light from said LEDs, and spaces between said LEDs for light passage,
wherein:
each one of said LEDs has a first electrode and a second electrode,
each one of said panels has a first metal part, a second metal part and an insulator insulating said first metal part from said second metal part, and
air spaces in said first metal part and said second metal part to provide said spaces for light passage and air circulation.

3. The light source as described in claim 2, wherein:
said first electrode is a bottom electrode and said second electrode is a top electrode;
said first metal part is a first metal plate where said bottom electrode is mounted;
said second metal part is a second metal plate having a window for said top electrode to expose and be wire-bonded to said top electrode;
an insulator is sandwiched between said first metal plate and said second metal plate; and
through-holes are cut in said first metal plate, said second metal plate and said insulator to serve as said air spaces.

4. The light source as described in claim 2, wherein:
said first electrode is a bottom electrode and said second electrode is a top electrode;
said first metal part is a first metal grid to which said bottom electrode is mounted at the cross-points of the ridges of said grid;
said second metal part is a second metal grid, offset from said first metal grid and to which said top electrode is wire-bonded;
insulators are sandwiched between said first metal grid and said second metal grid; and
through windows are placed in said first metal plate and said second metal plates to serve as said air spaces.

5. The light source as described in claim 4, further comprising a second LED placed in parallel with the LED at the cross-points of the ridges of said grid.

6. The light source as described in claim 2, wherein:
said first electrode is a bottom electrode and said second electrode is a top electrode;
said first metal part is a metal grid to which said bottom electrode is mounted at the cross-points of the ridges of said grid;
said second metal part is a metal rail insulated behind said metal grid and has pedestals protruded out for wire-bonding to said top electrode; and
through windows are provided in said metal grid and open spaces are provided between said metal rail to serve as said air spaces.

7. The light source as described in claim 2, wherein:
said first electrode and said second electrode are first bottom electrode and second bottom electrode, respectively;
said first metal part is a metal grid to which said first bottom electrode is attached;
said second metal part is a metal rail insulated behind said metal grid and has pedestals protruded out for said second bottom electrode to be attached and
through windows are provided in said metal grid and open spaces are provided between said metal rail to serve as said air spaces.

8. The light source as described in claim 2, wherein:
said first electrode and said second electrode are first bottom electrode and second bottom electrode;
said first metal part has a section of a first interdigital metal plate to which at least one of said first bottom electrode and said second bottom electrode is attached;
said second metal part has a section of a second interdigital metal plate which is mated with the first interdigital metal plate by attaching another of said first bottom electrode and said second bottom electrode, and
windows are cut in each tooth of said first interdigital metal frame and said second interdigital metal frame to serve as said air spaces.

9. The light source as described in claim 2, wherein:

said first electrode and said second electrode are first bottom electrode and second bottom electrode;

said first metal part has a first rectangular metal frame section to which at least one of said first bottom electrode and said second bottom electrode is attached;

said second metal part has a second rectangular metal frame section placed next to said first frame to which at least another of said first bottom electrode and said second bottom electrode is attached, said first rectangular metal frames and said second metal frames being alternately placed horizontally, such that the LEDs are in parallel or series connection; and windows are cut in each rectangular metal frame to serve as said air spaces.

10. The light source as described in claim 2, wherein:

said first electrode is a bottom electrode and said second electrode is a top electrode;

said first metal part has section of a first Z-shaped metal plate having a lower flange where said bottom electrode is attached;

said second metal part has a section of second Z-shaped metal plate having an upper flange overlaying said lower flange of said first Z-shaped metal plate and a window in said upper flange over the top electrode for bonding to said second Z-shaped metal plate, and having a lower flange for mounting another set of LEDs, said first Z-shaped metal frame and said second Z-shaped metal plate are alternately laid out linearly in series such that the LEDs are in series connection electrically; and windows are cut in each rectangular Z-shaped metal plate to serve as said air spaces.

11. The light source as described in claim 2, wherein:

said first electrode is a bottom electrode and said second electrode is a top electrode;

said first metal part has a section of first metal rail, to which said bottom electrode is attached;

said second metal part has a section of second metal rail parallel with and insulated from said first metal rail and to which said top electrode is wire-bonded; and a plurality of sections of said first metal rail and said second rail are laid out in and separated with openings between sections to serve as the air spaces.

12. The light source as described in claim 2, wherein:

said first electrode is a first bottom electrode and said second electrode is a second bottom electrode;

said first metal part has section of a first metal rail, to which said bottom electrode is attached;

said second metal part has a section of second metal rail parallel with and insulated from said first metal rail and to which said second electrode is attached, and a plurality of sections of first metal rail and said second rail are laid out in parallel and separated with openings between sections to serve as said air spaces.

13. The light source as described in claim 2, wherein:

said first electrode is a bottom metal electrode and said second electrode is a top electrode;

said first metal part is a section of parallel brackets each with pedestal for mounting said first electrode;

said second metal part has a section of a rail orthogonal with and overlaying over said metal brackets, and is wire-bonded to said top electrode;

separations between said parallel brackets provide said air spaces.

14. The light source as described in claim 13, further comprising extensions underneath said rail to serve as heat sinks.

15. The light source as described in claim 2, wherein:

said first electrode is a bottom electrode and said second electrode is a top electrode;

said first metal part has a section of parallel first metal bars to which said bottom electrode is attached;

said second metal part has a section of parallel metal rails orthogonal with and insulated from said first set of parallel first metal bars, and to which said top electrode is wire-bonded; and separations between said parallel metal bars and said parallel metal rails are provided to serve as said air spaces.

16. A light source for projection, comprising:

a matrix array of light emitting diodes (LED);

at least one panel for mounting said LEDs;

a reflector for reflecting emitted light from said LEDs, spaces between said LEDs for light passage;

a cover in front of said reflecting plate with inner surface coated with reflecting material, and a lens at the center of said cover for changing the divergence of the reflected light.

17. The light source as described in claim 16, further comprising a light guide coupled to said lens for guiding said reflected light.

* * * * *